United States Patent
Lee et al.

(10) Patent No.: US 11,296,078 B2
(45) Date of Patent: Apr. 5, 2022

(54) SEMICONDUCTOR DEVICE

(71) Applicant: Samsung Electronics Co., Ltd., Suwon-si (KR)

(72) Inventors: Byounghoon Lee, Suwon-si (KR); Jongho Park, Suwon-si (KR); Wandon Kim, Seongnam-si (KR); Sangjin Hyun, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 212 days.

(21) Appl. No.: 16/431,079

(22) Filed: Jun. 4, 2019

(65) Prior Publication Data

US 2020/0144255 A1 May 7, 2020

(30) Foreign Application Priority Data

Nov. 2, 2018 (KR) ........................ 10-2018-0133297

(51) Int. Cl.
*H01L 29/49* (2006.01)
*H01L 27/088* (2006.01)
(Continued)

(52) U.S. Cl.
CPC ...... *H01L 27/0886* (2013.01); *H01L 29/0673* (2013.01); *H01L 29/1037* (2013.01);
(Continued)

(58) Field of Classification Search
CPC ......... H01L 29/42392; H01L 29/42376; H01L 29/4958
See application file for complete search history.

(56) References Cited

U.S. PATENT DOCUMENTS 8,115,264 B2  2/2012  Park et al.
8,120,117 B2  2/2012  Tsuchiya
(Continued)

FOREIGN PATENT DOCUMENTS

JP    2011054872 A    3/2011
JP    2011243750 A    12/2011
(Continued)

OTHER PUBLICATIONS

Ma et al., The effects of process condition of top-TiN and TaN thickness on the effective work function of MOSCAP with high-k metal gate stacks, Oct. 2014, Journal of Semiconductors, vol. 35, 4pages (Year: 2014).*

*Primary Examiner* — Trang Q Tran
(74) *Attorney, Agent, or Firm* — Harness, Dickey & Pierce, P.L.C.

(57) ABSTRACT

A semiconductor device includes a plurality of semiconductor patterns that are sequentially stacked and spaced apart from each other on a substrate, and a gate electrode on the plurality of semiconductor patterns. The gate electrode includes a capping pattern and a work function pattern that are sequentially stacked on the plurality of semiconductor patterns. The capping pattern includes a first metal nitride layer including a first metal element, and a second metal nitride layer including a second metal element whose work function is greater than a work function of the first metal element. The first metal nitride layer is disposed between the second metal nitride layer and the plurality of semiconductor patterns. The first metal nitride layer is thinner than the second metal nitride layer.

19 Claims, 14 Drawing Sheets

(51) Int. Cl.
*H01L 29/423* (2006.01)
*H01L 29/10* (2006.01)
*H01L 29/06* (2006.01)
*H01L 21/28* (2006.01)
*H01L 21/8234* (2006.01)
*H01L 21/02* (2006.01)
*H01L 21/306* (2006.01)
*H01L 21/762* (2006.01)
*H01L 29/66* (2006.01)
*H01L 21/3213* (2006.01)
*H01L 29/08* (2006.01)
*H01L 29/78* (2006.01)
*H01L 29/165* (2006.01)

(52) U.S. Cl.
CPC .... *H01L 29/42392* (2013.01); *H01L 29/4966* (2013.01); *H01L 21/02532* (2013.01); *H01L 21/28088* (2013.01); *H01L 21/30604* (2013.01); *H01L 21/32139* (2013.01); *H01L 21/76224* (2013.01); *H01L 21/82345* (2013.01); *H01L 21/823412* (2013.01); *H01L 21/823418* (2013.01); *H01L 21/823431* (2013.01); *H01L 21/823468* (2013.01); *H01L 21/823481* (2013.01); *H01L 29/0847* (2013.01); *H01L 29/165* (2013.01); *H01L 29/66545* (2013.01); *H01L 29/66636* (2013.01); *H01L 29/7848* (2013.01)

(56) References Cited

U.S. PATENT DOCUMENTS

| | | | |
|---|---|---|---|
| 8,536,038 | B2 | 9/2013 | Wang et al. |
| 9,013,000 | B2 | 4/2015 | Choi |
| 9,245,806 | B2 | 1/2016 | Kang |
| 9,577,062 | B2 | 2/2017 | Jagannathan et al. |
| 9,960,160 | B2 | 5/2018 | Lin et al. |
| 2003/0080387 | A1 | 5/2003 | Cho et al. |
| 2010/0301429 | A1 | 12/2010 | Nabatame |
| 2012/0153406 | A1 | 6/2012 | Park et al. |
| 2016/0049400 | A1* | 2/2016 | Togo ............... H01L 21/26513 257/369 |
| 2017/0288018 | A1* | 10/2017 | Tung ............... H01L 29/66553 |
| 2019/0081152 | A1* | 3/2019 | Suh ............... H01L 21/28088 |
| 2019/0371675 | A1* | 12/2019 | Tsai ............... H01L 21/82345 |

FOREIGN PATENT DOCUMENTS

| | | |
|---|---|---|
| JP | 2012124215 A | 6/2012 |
| JP | 2013008787 A | 1/2013 |
| JP | 6149634 B2 | 6/2017 |
| KR | 20030002256 A | 1/2003 |
| KR | 20030058664 A | 7/2003 |
| KR | 100426441 B1 | 4/2004 |
| KR | 20080109218 A | 12/2008 |
| KR | 100899565 B1 | 5/2009 |
| KR | 101164973 B1 | 7/2012 |
| KR | 101212567 B1 | 12/2012 |
| KR | 20140003141 A | 1/2014 |
| KR | 20150092542 A | 8/2015 |

\* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2018-0133297 filed on Nov. 2, 2018 in the Korean Intellectual Property Office, the entire contents of which are hereby incorporated by reference.

BACKGROUND

Some example embodiments of the present inventive concepts relate to a semiconductor device, and more particularly, to a semiconductor device including a gate-all-around type transistor.

Semiconductor devices have an important role in the electronic industry because of small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronics industry. For example, semiconductor devices have been increasingly requested for high reliability, high speed, and/or multi-functionality. Semiconductor devices have been gradually complicated and integrated to meet these requested characteristics.

SUMMARY

Some example embodiments of the present inventive concepts provide a semiconductor device including gate-all-around type transistors with various threshold voltages.

According to some example embodiments of the present inventive concepts, a semiconductor device may include: a plurality of semiconductor patterns that are sequentially stacked and spaced apart from each other on a substrate; and a gate electrode on the plurality of semiconductor patterns. The gate electrode may include a capping pattern and a work function pattern that are sequentially stacked on the plurality of semiconductor patterns. The capping pattern may include a first metal nitride layer including a first metal element, and a second metal nitride layer including a second metal element whose work function is greater than a work function of the first metal element. The first metal nitride layer may be disposed between the second metal nitride layer and the plurality of semiconductor patterns. The first metal nitride layer may be thinner than the second metal nitride layer.

According to some example embodiments of the present inventive concepts, a semiconductor device may include: a substrate; and a plurality of transistors, including at least a first transistor and a second transistor, on the substrate. The first transistor may include a first gate dielectric layer and a first gate electrode that are sequentially stacked on a plurality of first semiconductor patterns, and the first gate electrode may include a first capping pattern and a first work function pattern that are sequentially stacked on the plurality of first semiconductor patterns. The second transistor may include a second gate dielectric layer and a second gate electrode that are sequentially stacked on a plurality of second semiconductor patterns, and the second gate electrode may include a first work function control pattern, a second capping pattern, and a second work function pattern that are sequentially stacked on the plurality of second semiconductor patterns. Each of the first capping pattern and the second capping pattern may include a first metal nitride layer including a first metal element, and a second metal nitride layer including a second metal element whose work function is greater than a work function of the first metal element.

According to some example embodiments of the present inventive concepts, a semiconductor device may include: a substrate; and a plurality of transistors, including at least a first transistor and a fourth transistor, on the substrate. The first transistor may include a first gate electrode including a first capping pattern on a plurality of first semiconductor patterns, and the first capping pattern may include a plurality of first sub-capping patterns surrounding the plurality of first semiconductor patterns. The fourth transistor may include a fourth gate electrode including a fourth capping pattern on a plurality of fourth semiconductor patterns, and the fourth capping pattern may include a plurality of second sub-capping patterns surrounding the plurality of fourth semiconductor patterns. One or more of the first capping pattern and the fourth capping pattern may include a plurality of different layers.

DETAILED DESCRIPTION

Figure 1:
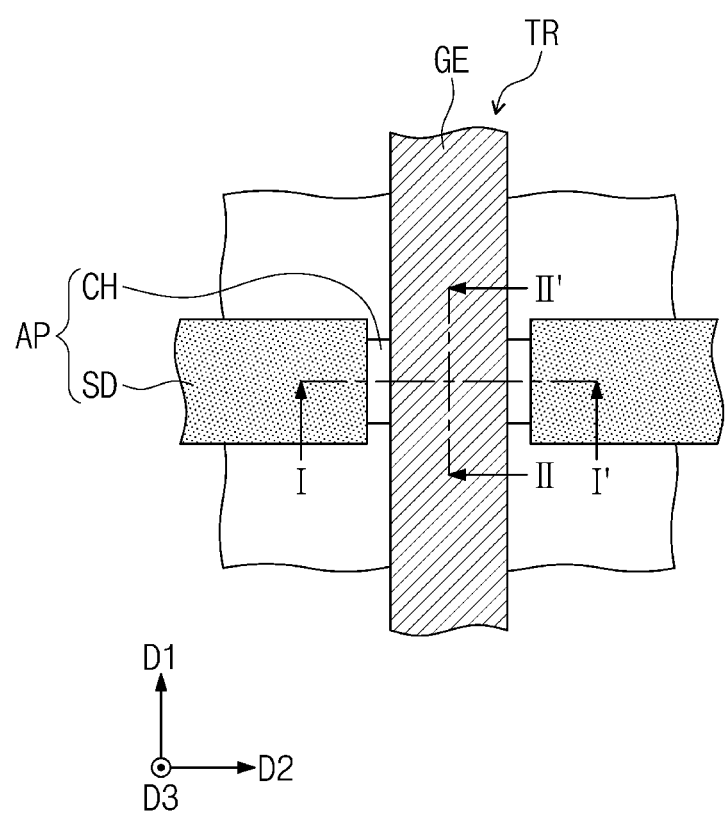
FIG. 1 illustrates a plan view showing a semiconductor device according to some example embodiments of the present inventive concepts.
Figure 2:
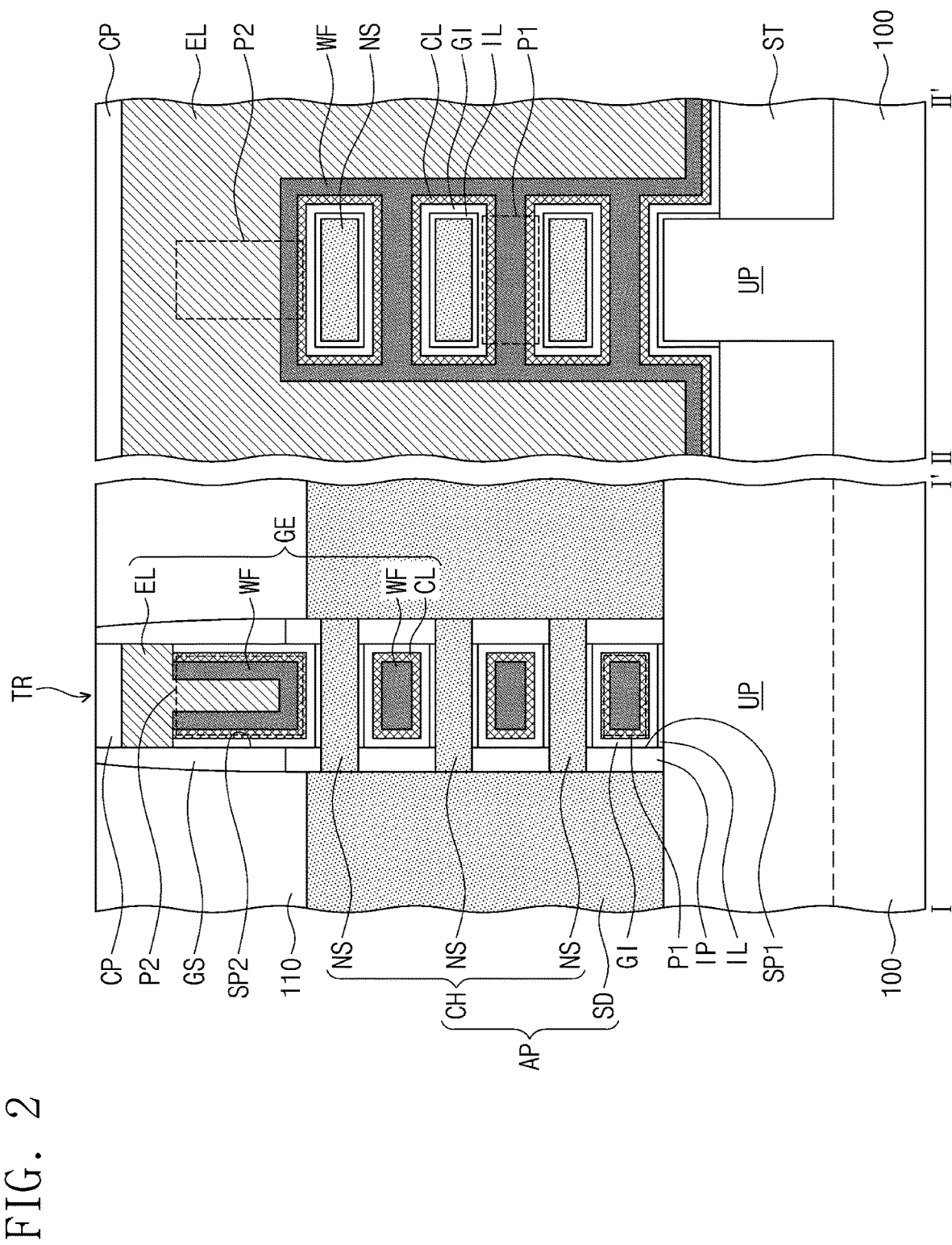
FIG. 2 illustrates cross-sectional views taken along lines I-I' and II-II' of FIG. 1.
Figure 3A:
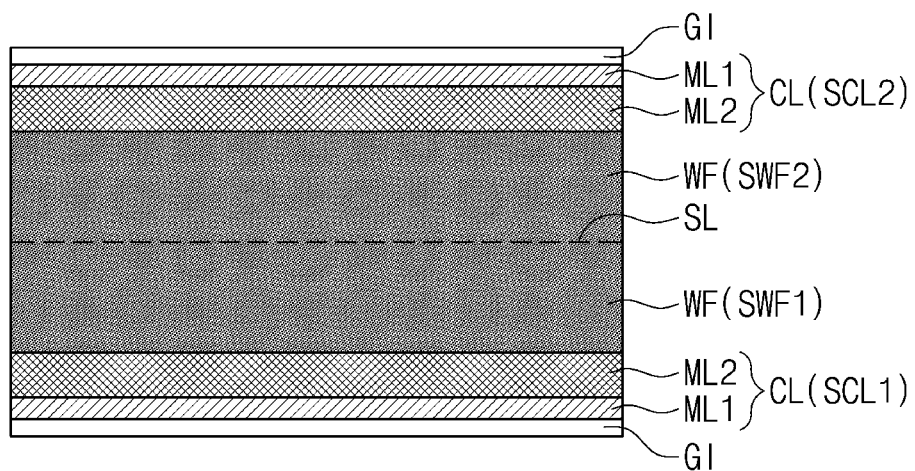
FIGS. 3A and 3B illustrate enlarged views showing section P1 of FIG. 2.
Figure 3B:
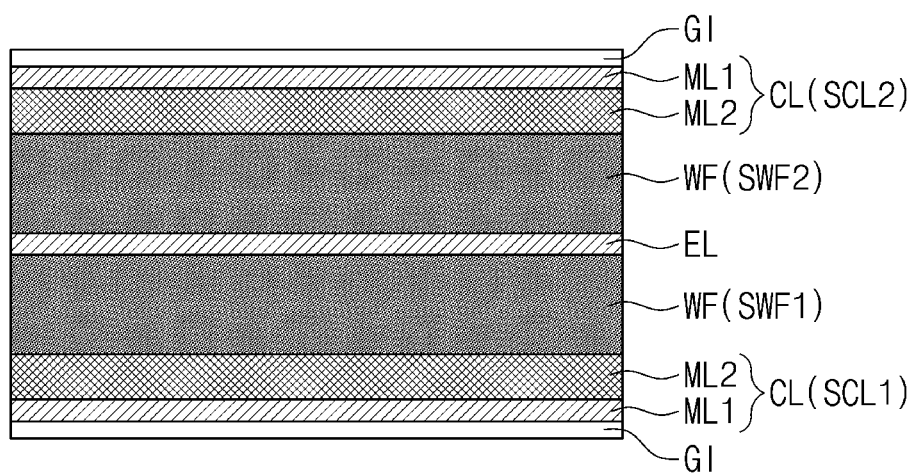

FIG. 1 illustrates a plan view showing a semiconductor device according to some example embodiments of the present inventive concepts. FIG. 2 illustrates cross-sectional views taken along lines I-I' and II-II' of FIG. 1. FIGS. 3A and 3B illustrate enlarged views showing section P1 of FIG. 2.

Referring to FIGS. 1, 2, 3A, and 3B, a transistor TR may be provided on a substrate 100. The substrate 100 may be a semiconductor substrate. For example, the substrate 100 may be a silicon substrate or a germanium substrate. For another example, the substrate 100 may be a silicon-on-insulator (SOI) substrate. The transistor TR may be provided on a memory cell region where a plurality of memory cells are formed to store data. For example, a memory cell region of the substrate 100 may be provided thereon with memory cell transistors included in a plurality of SRAM cells. The transistor TR may be one of the memory cell transistors.

Alternatively, the transistor TR may be provided on a logic cell region where logic transistors are to be included in a logic circuit of a semiconductor device. For example, logic transistors may be disposed on a logic cell region of the substrate 100. However, some example embodiments of the present inventive concepts are not limited thereto. The transistor TR may be an NMOSFET.

A device isolation layer ST may be provided on the substrate 100. The device isolation layer ST may define upper patterns UP on an upper portion of the substrate 100. The upper pattern UP may extend in a second direction D2. The device isolation layer ST may fill trenches on opposite sides of the upper pattern UP. The device isolation layer ST may have a top surface lower than that of the upper pattern UP.

An active pattern AP may be provided on the upper pattern UP. For example, the active pattern AP may vertically overlap the upper pattern UP. The active pattern AP may have a linear shape extending in the second direction D2.

The active pattern AP may include a channel pattern CH and source/drain patterns SD. The channel pattern CH may be interposed between a pair of the source/drain patterns SD. The channel pattern CH may include a plurality of vertically stacked semiconductor patterns NS.

The semiconductor patterns NS may be spaced apart from each other in a third direction D3 perpendicular to a top surface of the substrate 100. The semiconductor patterns NS may vertically overlap each other. Each of the source/drain patterns SD may be in direct contact with sidewalls of the semiconductor patterns NS. The semiconductor patterns NS may connect a pair of neighboring source/drain patterns SD to each other. Although three semiconductor patterns NS are illustrated, the number of the semiconductor patterns NS is not limited to three according to some other example embodiments. The semiconductor patterns NS may have the same thickness as each other or different thicknesses from each other. The semiconductor patterns NS may include one or more of Si, SiGe, and/or Ge.

The source/drain patterns SD may be epitaxial patterns formed from the semiconductor patterns NS and the upper patterns UP that are used as seed layers. In some example embodiments, when the transistor TR is a PMOSFET, the source/drain patterns SD may include a material that provides the channel pattern CH with a compressive strain. For example, the source/drain patterns SD may include a semiconductor element (e.g., SiGe) whose lattice constant is greater than that of a semiconductor element of the channel pattern CH (e.g., Si). In this description, the phrase "include(s) a certain element" may exclude the expression "include(s) an unintentional impurity." The source/drain patterns SD may be doped with impurities to have a P-type conductivity.

In some other example embodiments, when the transistor TR is an NMOSFET, the source/drain patterns SD may include a material that provides the channel pattern CH with a tensile strain. For example, the source/drain patterns SD may include a semiconductor element whose lattice constant is less than that of a semiconductor element of the channel pattern CH. Alternatively, the source/drain patterns SD may include the same semiconductor element (e.g., Si) as that of the channel pattern CH. The source/drain patterns SD may be doped with impurities to have an N-type conductivity.

A gate electrode GE may be provided to extend in a first direction D1, while running across the channel pattern CH. The gate electrode GE may include a capping pattern CL and a work function pattern WF that are sequentially stacked on the semiconductor patterns NS. The gate electrode GE may further include an electrode pattern EL. The electrode pattern EL may be disposed on the work function pattern WF. The electrode pattern EL may have a resistivity less than that of the work function pattern WF. For example, the electrode pattern EL may include at least one low-resistance or low-resistivity metal, such as tungsten (W), titanium (Ti), and/or tantalum (Ta). In some example embodiments, the electrode pattern EL may include a barrier pattern (not shown) on a boundary between the electrode pattern EL and the work function pattern WF. The barrier pattern may be conformally disposed along a top surface of the work function pattern WF. The barrier pattern may include at least one nitride layer that contains one or more of tungsten (W), titanium (Ti), and/or tantalum (Ta). For example, the barrier pattern may be a TiN layer. In some other example embodiments, the electrode pattern EL may include no barrier pattern.

The work function pattern WF may fill first spaces SP1 between the semiconductor patterns NS. The work function pattern WF may surround each of the semiconductor patterns NS. For example, the work function pattern WF may surround top surfaces, bottom surfaces, and sidewalls of the semiconductor patterns NS. In such cases, the transistor TR may be a gate-all-around type field effect transistor.

The gate electrode GE may include a first part P1 and a second part P2. The first part P1 may be positioned in the first space SP1 between the semiconductor patterns NS that are vertically adjacent to each other. For example, the first part P1 may be a segment between the semiconductor patterns NS that are vertically adjacent to each other.

The second part P2 may be positioned in a second space SP2 on an uppermost semiconductor pattern NS. The second space SP2 may be an area surrounded by the uppermost semiconductor pattern NS and a pair of gate spacers GS, which will be discussed below. For example, the second part P2 may be a segment on the uppermost semiconductor pattern NS and between a pair of gate spacers GS. The electrode pattern EL may be spaced apart from the first part P1 of the gate electrode GE.

The second part P2 of the gate electrode GE may include the work function pattern WF, the capping pattern CL, and the electrode pattern EL that are sequentially stacked. A pair of gate spacers GS may be disposed on opposite sidewalls of the gate electrode GE. The gate spacers GS may extend in the first direction D1 along the gate electrode GE. The gate spacers GS may have their top surfaces higher than that of the gate electrode GE. For example, the gate spacers GS may include one or more of SiCN, SiCON, and/or SiN. For another example, the gate spacers GS may include a multilayer including two or more of SiCN, SiCON, and/or SiN.

A gate capping layer CP may be provided on the gate electrode GE. The gate capping layer CP may extend in the first direction D1 along the gate electrode GE. The gate capping layer CP may have a top surface coplanar with those of the gate spacers GS. The gate capping layer CP may include a material having an etch selectivity with respect to an interlayer dielectric layer 110 which will be discussed below. For example, the gate capping layer CP may include one or more of SiON, SiCN, SiCON, and/or SiN.

Dielectric patterns IP may be interposed between the source/drain patterns SD and the gate electrode GE. The dielectric patterns IP may be interposed between the semiconductor patterns NS that are vertically spaced apart from each other. The dielectric patterns IP may electrically insulate the gate electrode GE from the source/drain patterns SD. The first space SP1 may be defined by a pair of the dielectric patterns IP horizontally adjacent to each other and a pair of the semiconductor patterns NS vertically adjacent to each other. For example, the dielectric patterns IP may include a silicon nitride layer.

An interface layer IL may be provided to surround the semiconductor patterns NS. The interface layer IL may directly cover the semiconductor patterns NS. For example, the interface layer IL may include a silicon oxide layer. The interface layer IL may cover a top surface and a sidewall of the upper pattern UP, which sidewall is exposed by the device isolation layer ST.

A gate dielectric layer GI may be interposed between the gate electrode GE and each of the semiconductor patterns NS. The gate dielectric layer GI may conformally fill a portion of the first space SP1. The gate dielectric layer GI may include a high-k dielectric material whose dielectric constant is greater than that of a silicon oxide layer. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The work function pattern WF may be a metal carbide layer or a metal nitride layer in which silicon or aluminum is doped (or contained). In some example embodiments, the work function pattern WF may include a TiAlC layer, a TiSiC layer, a TaSiC layer, a TaAlC layer, a TiSiN layer, a TaSiN layer, a TiAlN layer, or a TaAlN layer. A work function of the work function pattern WF may be adjusted by controlling concentration of dopants such as silicon and/or aluminum. For example, the work function pattern WF may have impurities (e.g., silicon and/or aluminum) whose concentration falls within a range from about 0.1 at % to about 25 at %. In some other example embodiments, the work function pattern WF may be a titanium nitride (TiN) layer or a titanium oxynitride (TiON) layer.

As shown in FIG. 3A, the capping pattern CL may include a first metal nitride layer ML1 and a second metal nitride layer ML2. The first metal nitride layer ML1 may include a first metal element, and the second metal nitride layer ML2 may include a second metal element. The second metal element may have a work function greater than that of the first metal element. For example, the first metal element may be an element whose work function is less than that of the second metal element. For example, the second metal element may be titanium (Ti), tantalum (Ta), molybdenum (Mo), or tungsten (W), and the first metal element may be aluminum (Al), niobium (Nb), magnesium (Mg), lanthanum (La), or vanadium (V). The first metal nitride layer ML1 may further include the second metal element. The first metal element may have a ratio of about 5 at % to about 25 at % in the first metal nitride layer ML1.

The first metal nitride layer ML1 may be an AlN layer or a TiAlN layer, and the second metal nitride layer ML2 may be a TiN layer or a TiAlN layer. A combination of the first and second metal nitride layers ML1 and ML2 may be an AlN/TiN layer, an AlN/TiAlN layer, or a TiAlN/TiN layer. In some example embodiments, positions of the first metal nitride layer ML1 and the second metal nitride layer ML2 may be changed relative to each other.

The capping pattern CL may prevent (inhibit, limit, or reduce) diffusion of dopants contained in the work function pattern WF. For example, the capping pattern CL may not allow the gate dielectric layer GI to receive a metal element, such as aluminum, contained in the work function pattern WF, which may prevent (inhibit, limit, or reduce) a variation in threshold voltage of the transistor TR.

Each of the first and second metal nitride layers ML1 and ML2 may prevent (inhibit, limit, or reduce) diffusion of dopants contained in the work function pattern WF. For example, the work function pattern WF may include the first metal element. In this case, the first metal element contained in the first metal nitride layer ML1 may have a greater bonding strength with neighboring atoms than that of the first metal element contained in the work function pattern WF, with the result that diffusion of dopants contained in the work function pattern WF may be prevented (inhibited, limited, or reduced). For example, the work function pattern WF may include the first metal element, the second metal element, and carbon.

The first metal nitride layer ML1 may reduce a threshold voltage of the transistor TR. A work function of the first metal element contained in the first metal nitride layer ML1 may be less than that of the second metal element contained in the second metal nitride layer ML2, and thus the threshold voltage of the transistor TR may be reduced compared to a case in which the first metal nitride layer ML1 is not provided.

The first metal nitride layer ML1 may adjust the threshold voltage of the transistor TR. For example, the threshold voltage of the transistor TR may decrease with increasing concentration of the first metal element contained in the first metal nitride layer ML1, and may increase with increasing thickness of the first metal nitride layer ML1.

A resistivity of the second metal nitride layer ML2 may be less than that of the first metal nitride layer ML1. The first metal nitride layer ML1 may be thinner than the second metal nitride layer ML2. The second metal nitride layer ML2 may be about 2 times to about 5 times thicker than the first metal nitride layer ML1. For example, the first metal nitride layer ML1 may have a thickness of about 3 Å to about 10 Å, and the second metal nitride layer ML2 may have a thickness of about 11 Å to about 20 Å.

The semiconductor patterns NS may include a first sub-semiconductor pattern and a second sub-semiconductor pattern on the first sub-semiconductor pattern. The capping pattern CL may include a first sub-capping pattern SCL1 surrounding the first sub-semiconductor pattern and a second sub-capping pattern SCL2 surrounding the second sub-semiconductor pattern. The work function pattern WF may extend between the first sub-capping pattern SCL1 and the second sub-capping pattern SCL2.

The work function pattern WF may include a first sub-work function pattern SWF1 surrounding the first sub-semiconductor pattern and a second sub-work function pattern SWF2 surrounding the second sub-semiconductor pattern. In some example embodiments, as shown in FIG. 3A, the first sub-work function pattern SWF1 and the second sub-work function pattern SWF2 may be in contact with each other at an interface SL therebetween. In some other example embodiments, as shown in FIG. 3B, a portion of the electrode pattern EL may extend between the first sub-work function pattern SWF1 and the second sub-work function pattern SWF2.

An interlayer dielectric layer 110 may be provided on an entire surface of the substrate 100. The interlayer dielectric layer 110 may cover the source/drain patterns SD. The interlayer dielectric layer 110 may have a top surface substantially coplanar with that of the gate capping layer CP. For example, the interlayer dielectric layer 110 may include a silicon oxide layer or a silicon oxynitride layer. Although not shown, contacts may be provided to penetrate the interlayer dielectric layer 110 and to have connection with the source/drain patterns SD. The contacts may include a metallic material, such as tungsten (W), titanium (Ti), and/or tantalum (Ta).

A gate-all-around type transistor such as that disclosed in some example embodiments of the present inventive concepts may have a gate length that decreases with high integration, such that it may be difficult to adjust a threshold voltage by controlling the thickness of a work function layer and/or a work function control layer. In particular, for an NMOSFET, there may be a limitation on the extent to which its threshold voltage may be reduced by decreasing the thickness of a work function control layer. According to some example embodiments of the present inventive concepts, a capping pattern CL composed of a double layer may be provided. The double layer capping pattern CL may prevent (inhibit, limit, or reduce) diffusion of dopants contained in the work function pattern WF, and the threshold voltage of the transistor TR may be decreased (e.g., the threshold voltage may be reduced by a desired extent, without changing the thickness of the work function control layer).

Figure 4:
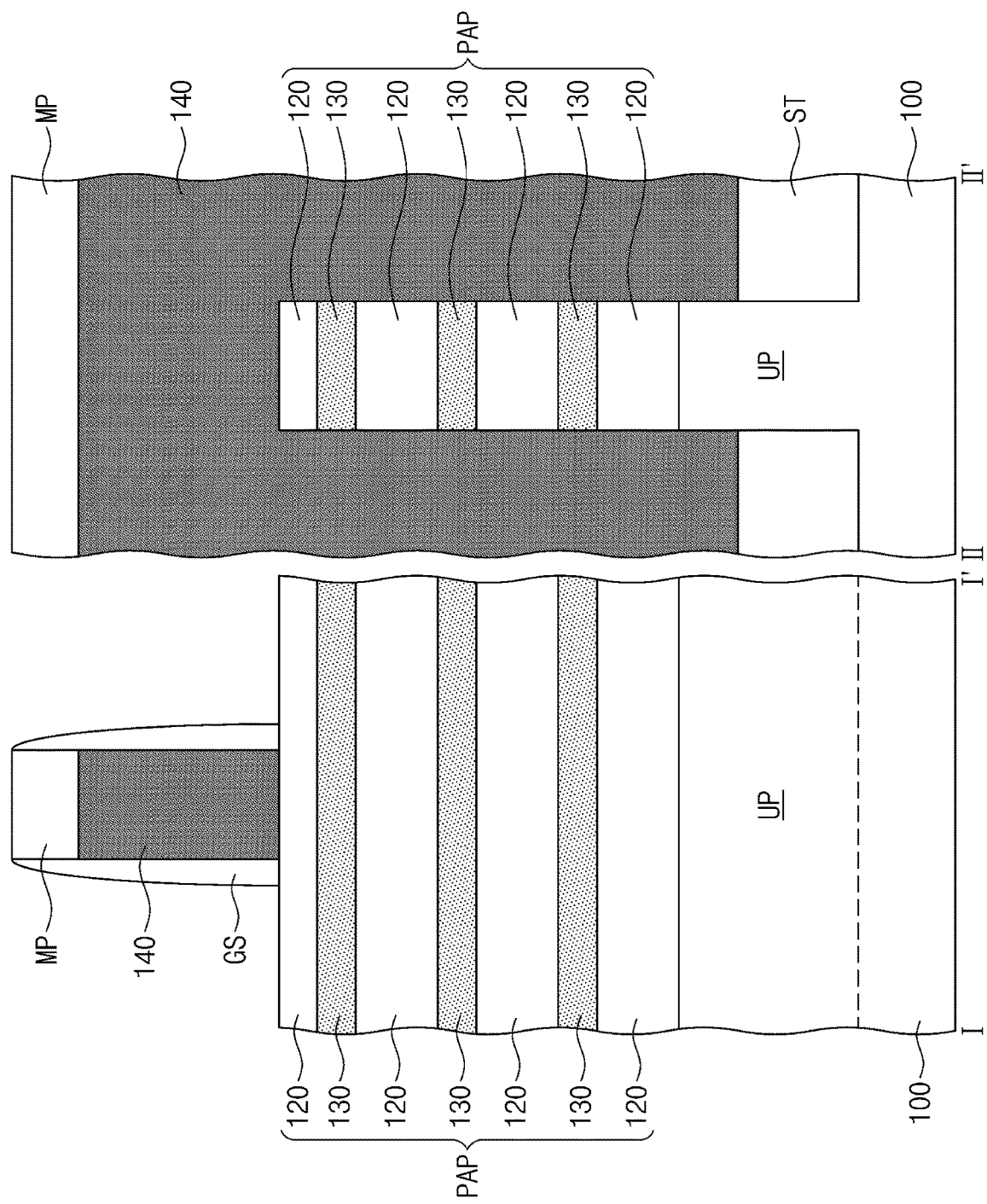
FIGS. 4 to 6 illustrate cross-sectional views taken along lines I-I' and II-II' of FIG. 1, showing a method of fabricating a semiconductor device according to some example embodiments of the present inventive concepts.
Figure 5:
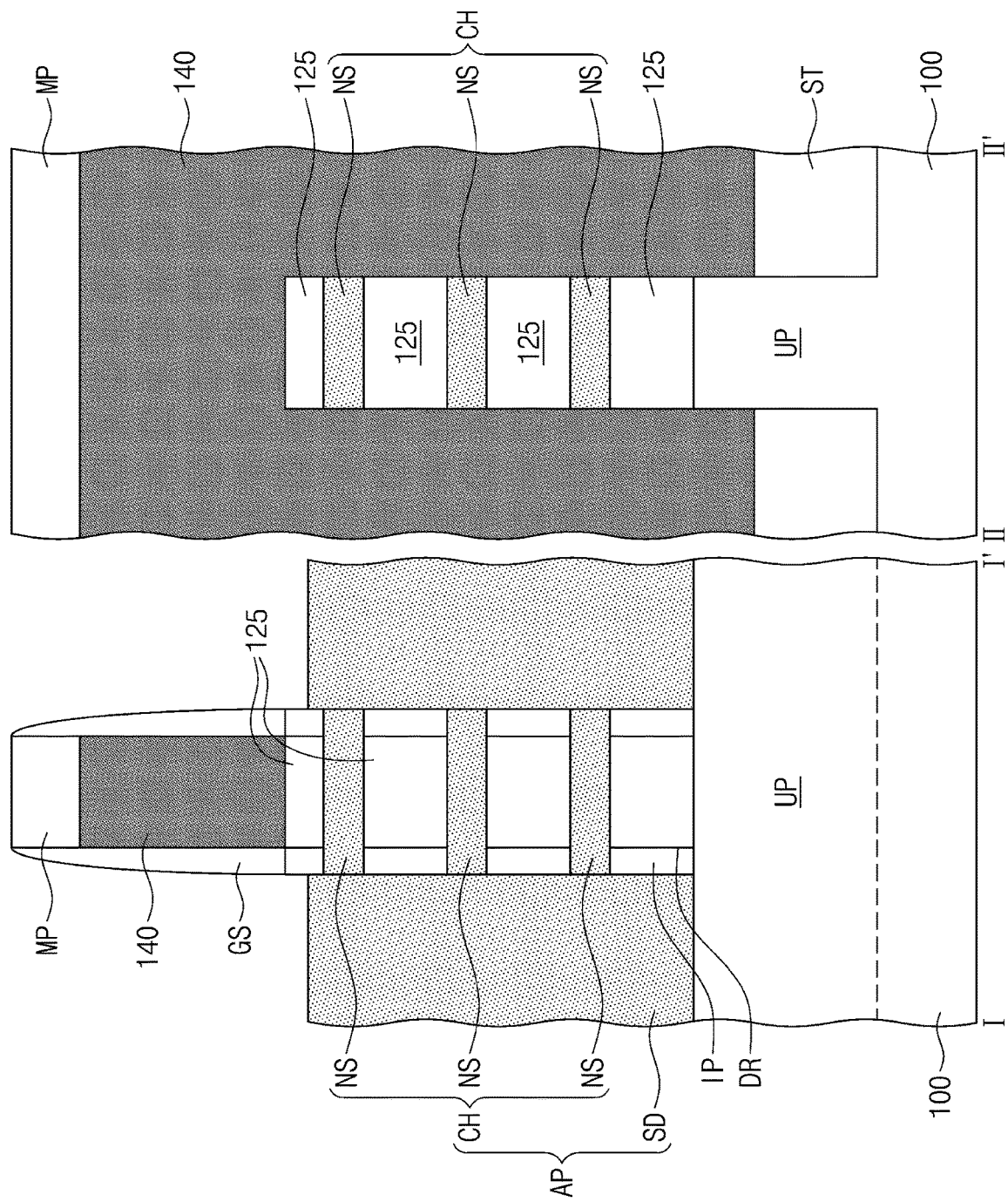
Figure 6:
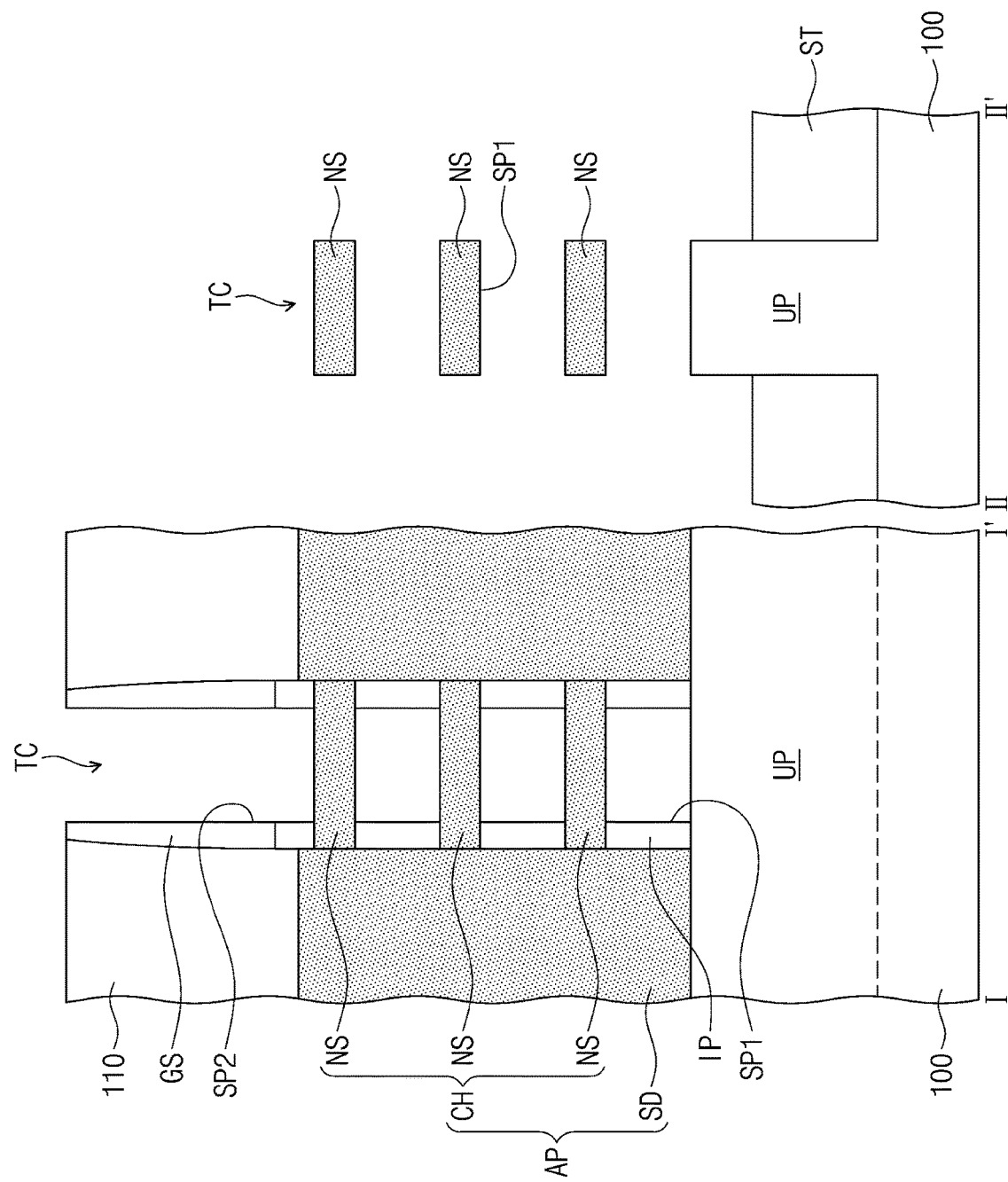

FIGS. 4 to 6 illustrate cross-sectional views taken along lines I-I' and II-II' of FIG. 1, showing a method of fabricating a semiconductor device according to some example embodiments of the present inventive concepts. A description of duplicate components will be omitted in the interest of brevity.

Referring to FIGS. 1 and 4, sacrificial layers 120 and semiconductor layers 130 may be alternately and repeatedly stacked on an entire surface of a substrate 100. The semiconductor layers 130 may be repeatedly stacked three times, but some other example embodiments of the present inventive concepts are not limited thereto. The sacrificial layers 120 may include a material having an etch selectivity with respect to the semiconductor layers 130. In some example embodiments, the semiconductor layers 130 may include a material that is not substantially etched in a process where the sacrificial layers 120 are etched. For example, in the process where the sacrificial layers 120 are etched, an etch rate ratio of the sacrificial layers 120 to the semiconductor layers 130 may fall within a range from about 10:1 to about 200:1. For example, the sacrificial layers 120 may include SiGe or Ge, and the semiconductor layers 130 may include Si.

The sacrificial layers 120 and the semiconductor layers 130 may be formed by an epitaxial growth process in which the substrate 100 is used as a seed layer. The sacrificial layers 120 and the semiconductor layers 130 may be successively formed in the same chamber. The sacrificial layers 120 and the semiconductor layers 130 may be conformally grown on the entire surface of the substrate 100.

The sacrificial layers 120, the semiconductor layers 130, and the substrate 100 may be patterned to form preliminary active patterns PAP. The patterning process may etch an upper portion of the substrate 100 to form upper patterns UP.

The preliminary active pattern PAP may be disposed on the upper pattern UP. The preliminary active pattern PAP may be formed to have a linear or bar shape extending in a second direction D2.

When the patterning process etches the upper portion of the substrate 100, trenches may be formed on opposite sides of the upper pattern UP. A device isolation layer ST may be formed to fill the trenches. The formation of the device isolation layer ST may include forming a dielectric layer on the entire surface of the substrate 100 and recessing the dielectric layer until the preliminary active pattern PAP is completely exposed. Accordingly, the device isolation layer ST may have a top surface lower than those of the upper patterns UP.

A sacrificial gate pattern 140 may be formed to run across the preliminary active pattern PAP. The sacrificial gate pattern 140 may be formed to have a linear or bar shape extending in a first direction D1. Gate mask patterns MP may be provided on corresponding sacrificial gate patterns 140. The formation of the sacrificial gate pattern 140 and the gate mask patterns MP may include sequentially forming on the substrate 100 a sacrificial gate layer and a gate mask layer, and sequentially patterning the gate mask layer and the sacrificial gate layer. The sacrificial gate layer may include polysilicon. The gate mask layer may include a silicon nitride layer or a silicon oxynitride layer.

A pair of gate spacers GS may be formed on opposite sidewalls of the sacrificial gate pattern 140. For example, the gate spacers GS may include one or more of SiCN, SiCON, and/or SiN. The formation of the gate spacers GS may include forming a spacer layer by a deposition process such as chemical vapor deposition (CVD) or atomic layer deposition (ALD), and performing an anisotropic etching process on the spacer layer.

Referring to FIGS. 1 and 5, the preliminary active pattern PAP may be patterned to a form channel pattern CH. The preliminary active pattern PAP may be patterned by using the gate mask patterns MP and the gate spacers GS as an etching mask. The upper pattern UP may therefore be partially exposed by the gate mask patterns MP and the gate spacers GS.

For example, the sacrificial layers 120 of the preliminary active pattern PAP may be patterned to form sacrificial patterns 125. The semiconductor layers 130 of the preliminary active pattern PAP may be patterned to form semiconductor patterns NS. After the patterning process, exposed portions of the sacrificial patterns 125 may be horizontally removed to form depression regions DR. The formation of the depression regions DR may include performing an etching process using an etching source that has an etch selectivity with respect to the sacrificial patterns 125. For example, when the semiconductor patterns NS include Si and the sacrificial patterns 125 include SiGe, the formation of the depressed regions DR may include performing an etching process that uses an etchant including peracetic acid.

Dielectric patterns IP may be formed to fill the depression regions DR. The dielectric patterns IP may be vertically spaced apart from each other across the semiconductor patterns NS. For example, a dielectric layer may be conformally formed on the entire surface of the substrate 100. The dielectric layer may fill the depression regions DR. After that, the dielectric layer may be etched until the dielectric patterns IP remain locally in the depression regions DR.

Source/drain patterns SD may be formed on opposite sides of each of the channel patterns CH. For example, the source/drain patterns SD may be formed by an epitaxial growth process in which the upper patterns UP are used as seed layers. The channel patterns CH and the source/drain patterns SD may be connected to each other to be included in active patterns AP extending in the second direction D2.

In some example embodiments, the source/drain patterns SD may be formed of a material that provides the channel patterns CH with a compressive strain. For example, the source/drain patterns SD may be formed of SiGe whose lattice constant is greater than that of Si. Simultaneously during or after the selective epitaxial growth process, the source/drain patterns SD may be doped with P-type impurities.

In some other example embodiments, the source/drain patterns SD may be formed of the same semiconductor element (e.g., Si) as that of the channel pattern CH. Simultaneously during or after the selective epitaxial growth process, the source/drain patterns SD may be doped with N-type impurities.

Referring to FIGS. 1 and 6, an interlayer dielectric layer 110 may be formed on the entire surface of the substrate 100. A planarization process may be performed on the interlayer dielectric layer 110 until a top surface of the sacrificial gate pattern 140 is exposed. The planarization process may include an etch-back process and/or a chemical mechanical polishing (CMP) process. When the interlayer dielectric layer 110 is planarized, the gate mask patterns MP may also be removed. For example, the interlayer dielectric layer 110 may be formed of a silicon oxide layer or a silicon oxynitride layer.

A selective removal may be performed on the sacrificial gate pattern 140 exposed by the planarization process. The removal of the sacrificial gate pattern 140 may form a trench TC on the substrate 100. The trench TC may expose the sacrificial patterns 125. The exposed sacrificial patterns 125 may be selectively removed. For example, when the sacrificial patterns 125 include SiGe and the semiconductor patterns NS include Si, the selective etching process may use an etchant including peracetic acid. The etchant may further include hydrofluoric acid (HF) solution and a deionized water. The source/drain patterns SD may be covered with the dielectric patterns IP and the interlayer dielectric layer 110, and may thus be protected from the selective etching process.

The sacrificial patterns 125 may be removed to form first spaces SP1 and second spaces SP2. The first space SP1 may be an empty area between the semiconductor patterns NS that are vertically adjacent to each other. The second space SP2 may be an empty area surrounded by a pair of the gate spacers GS and an uppermost semiconductor pattern NS. The first and second spaces SP1 and SP2 may be spatially connected to the trench TC, exposing the semiconductor patterns NS.

Referring back to FIGS. 1, 2, and 3A, an interface layer IL, a gate dielectric layer GI, and a gate electrode GE may be sequentially formed in the trench TC. The formation of the interface layer IL may include performing an oxidation process using plasma on the semiconductor patterns NS exposed to the trench TC. Thus, the interface layer IL may be grown from the exposed semiconductor patterns NS. The interface layer IL may directly surround surfaces of the exposed semiconductor patterns NS.

The formation of the interface layer IL may include a thermal oxidation process and/or a chemical oxidation process. The oxidation process may use one or more of oxygen plasma, ozone plasma, and/or vapor plasma. For example, the interface layer IL may include a silicon oxide layer.

The gate electric layer GI may be conformally formed on the interface layer IL. The gate dielectric layer GI may partially fill the first spaces SP1 of the trench TC. The gate dielectric layer GI may partially fill the second space SP2. The gate dielectric layer GI may directly cover the dielectric patterns IP and the interface layer IL. The gate dielectric layer GI may be formed using a high-k dielectric material whose dielectric constant is greater than that of a silicon oxide layer.

The formation of the gate electrode GE may include sequentially forming a capping pattern CL, a work function pattern WF, and an electrode pattern EL on the gate dielectric layer GI. The capping pattern CL may be formed by a deposition process such as ALD. The capping pattern CL may include a first metal nitride layer ML1 and a second metal nitride layer ML2. The first metal nitride layer ML1 and the second metal nitride layer ML2 may be formed in-situ. For example, the first metal nitride layer ML1 and the second metal nitride layer ML2 may be successively formed in the same chamber.

The first metal nitride layer ML1 may be formed of a nitride layer including a first metal element whose work function is low, such as aluminum (Al), niobium (Nb), magnesium (Mg), lanthanum (La), or vanadium (V). For example, when the first metal nitride layer ML1 is an aluminum nitride layer, TMA, TEA, or AlCl4 may be used as an aluminum precursor and NH3 may be used as a nitrogen source. A concentration of aluminum of the first metal nitride layer ML1 may be adjusted by controlling a supply cycle of the aluminum precursor and the nitrogen source. A purge step may be performed between a step of supplying the aluminum precursor and a step of supplying the nitrogen source.

The second metal nitride layer ML2 may be formed of a nitride layer including a second metal element such as titanium (Ti), tantalum (Ta), molybdenum (Mo), or tungsten (W). For example, when the second metal nitride layer ML2 is a titanium nitride layer, TICl4 may be used as a titanium precursor and NH3 may be used as a nitrogen source. A purge step may be performed between a step of supplying the titanium precursor and a step of supplying the nitrogen source.

The work function pattern WF may be formed by a deposition process such as ALD. For example, the work function pattern WF may be formed of a metal carbide layer or a metal nitride layer in which silicon or aluminum is doped (or contained). The capping pattern CL and the work function pattern WF may partially fill the second space SP2. In addition, the capping pattern CL and the work function pattern WF may completely fill the first spaces SP1.

A process may be performed to recess upper portions of the gate dielectric layer GI, the capping pattern CL, and the work function pattern WF that are formed in the second space SP2. Thereafter, an electrode pattern EL and a gate capping layer CP may be sequentially formed to fill the second space SP2.

Figure 7:
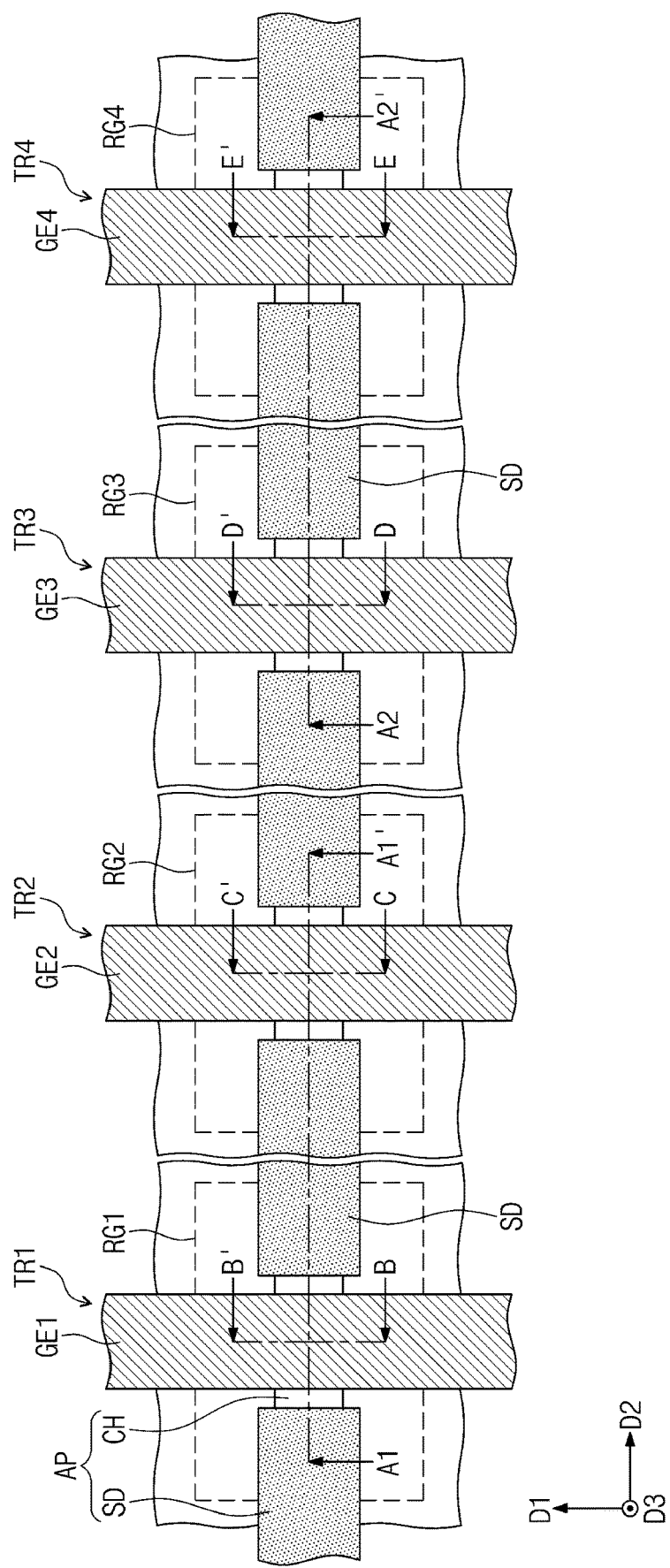
FIG. 7 illustrates a plan view showing a semiconductor device according to some example embodiments of the present inventive concepts.
Figure 8:
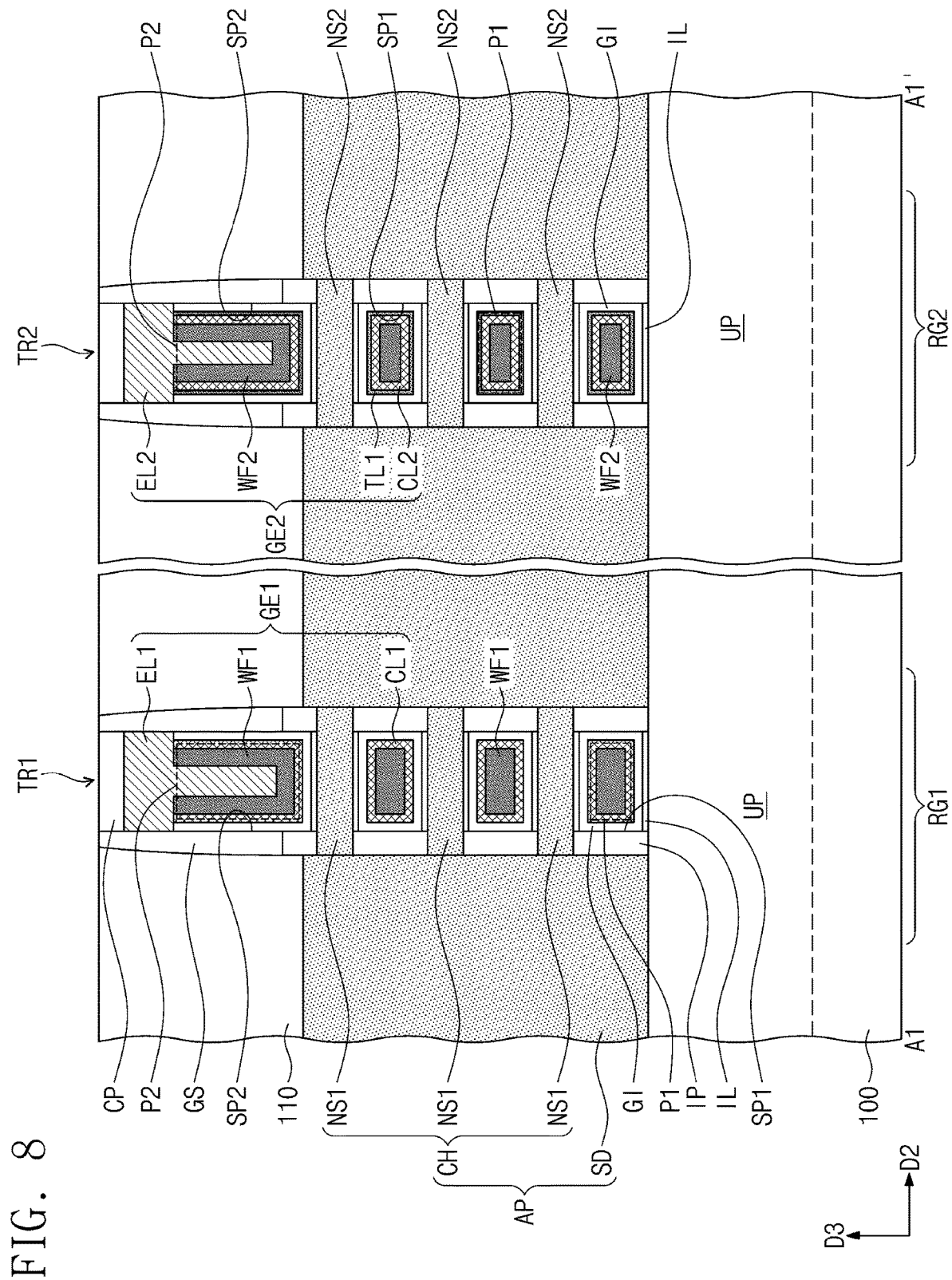
FIG. 8 illustrates a cross-sectional view taken along line A1-A1' of FIG. 7.
Figure 9:
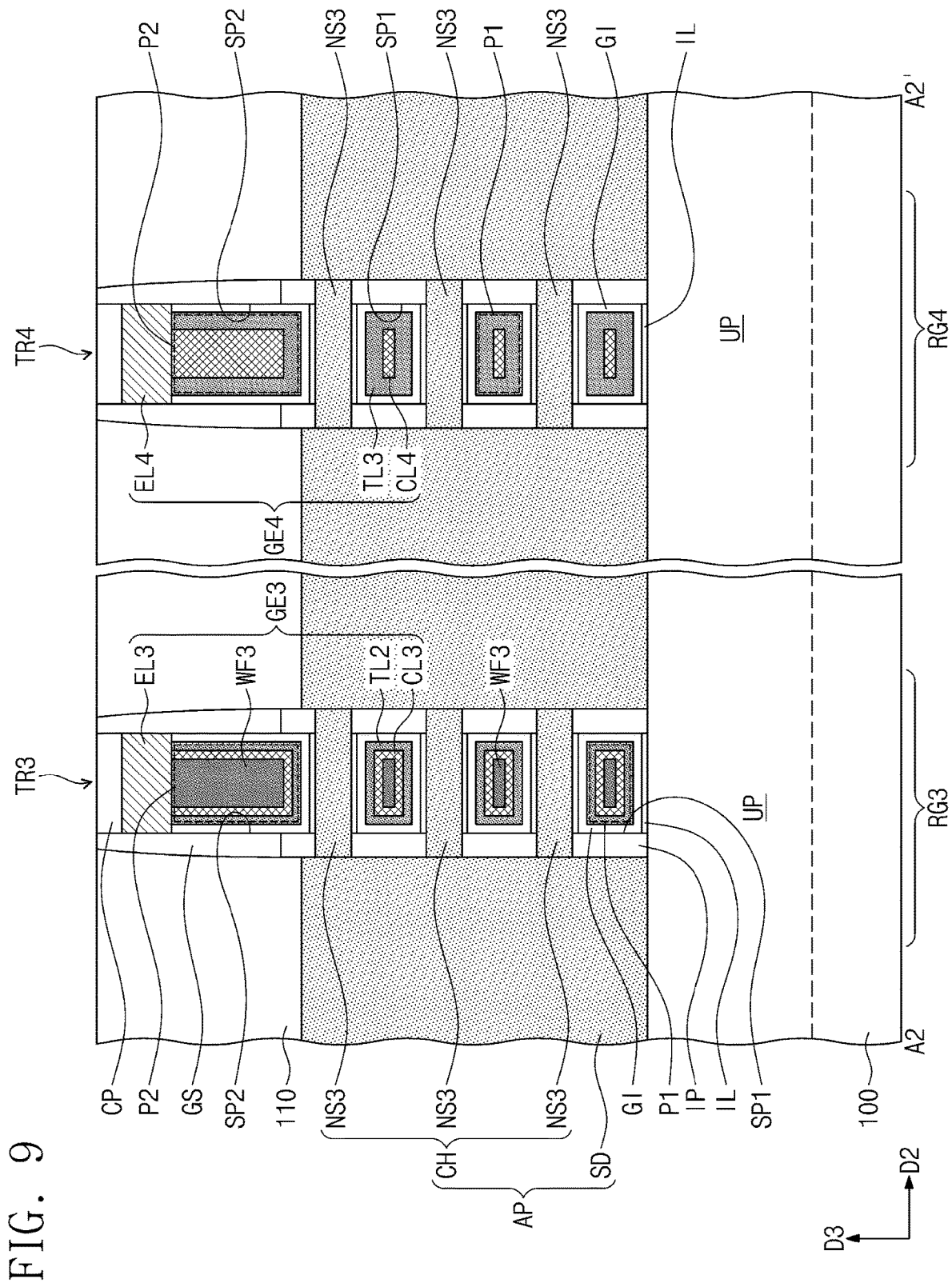
FIG. 9 illustrates a cross-sectional view taken along line A2-A2' of FIG. 7.
Figure 10:
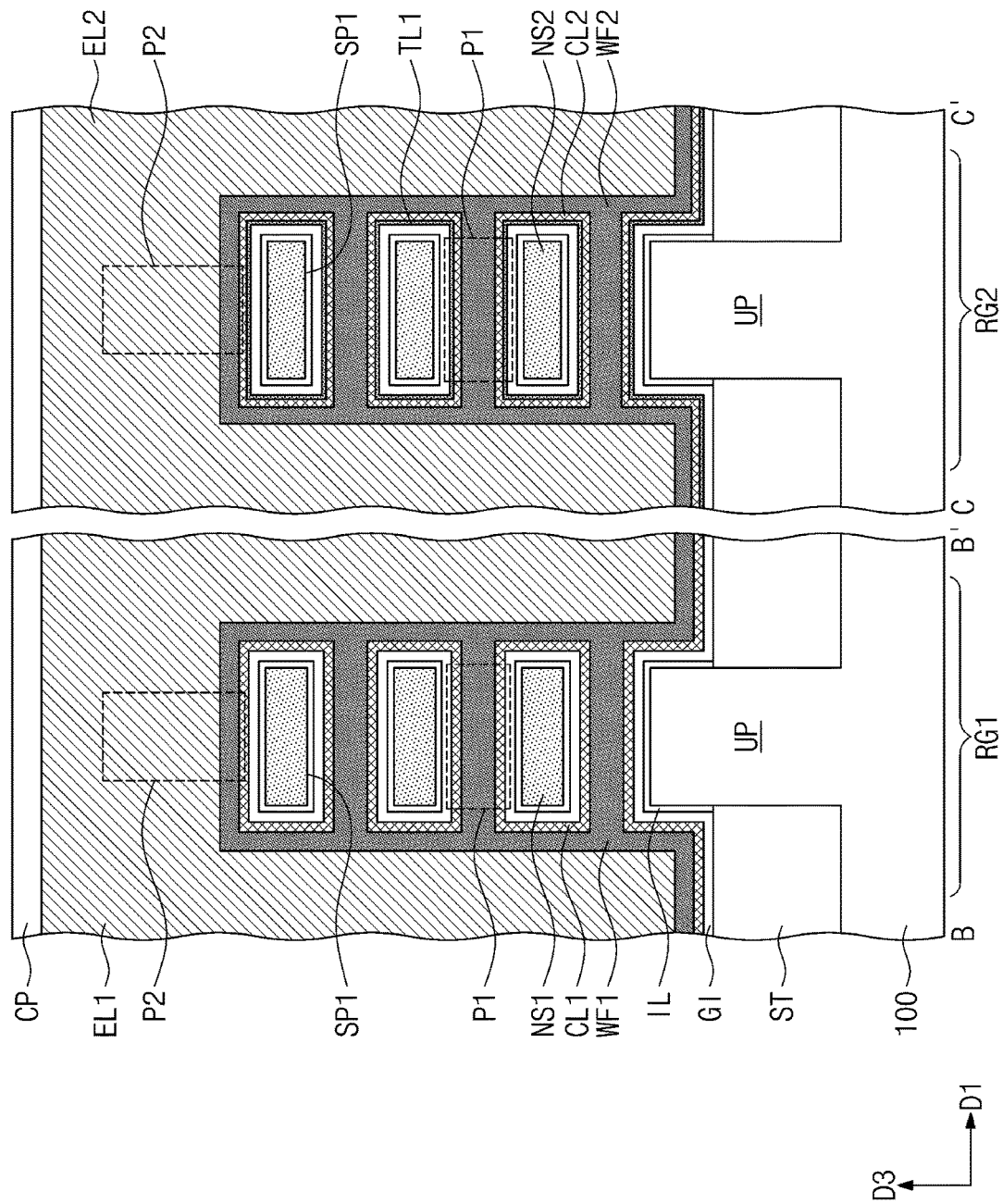
FIG. 10 illustrates a cross-sectional view taken along lines B-B' and C-C' of FIG. 7.
Figure 11:
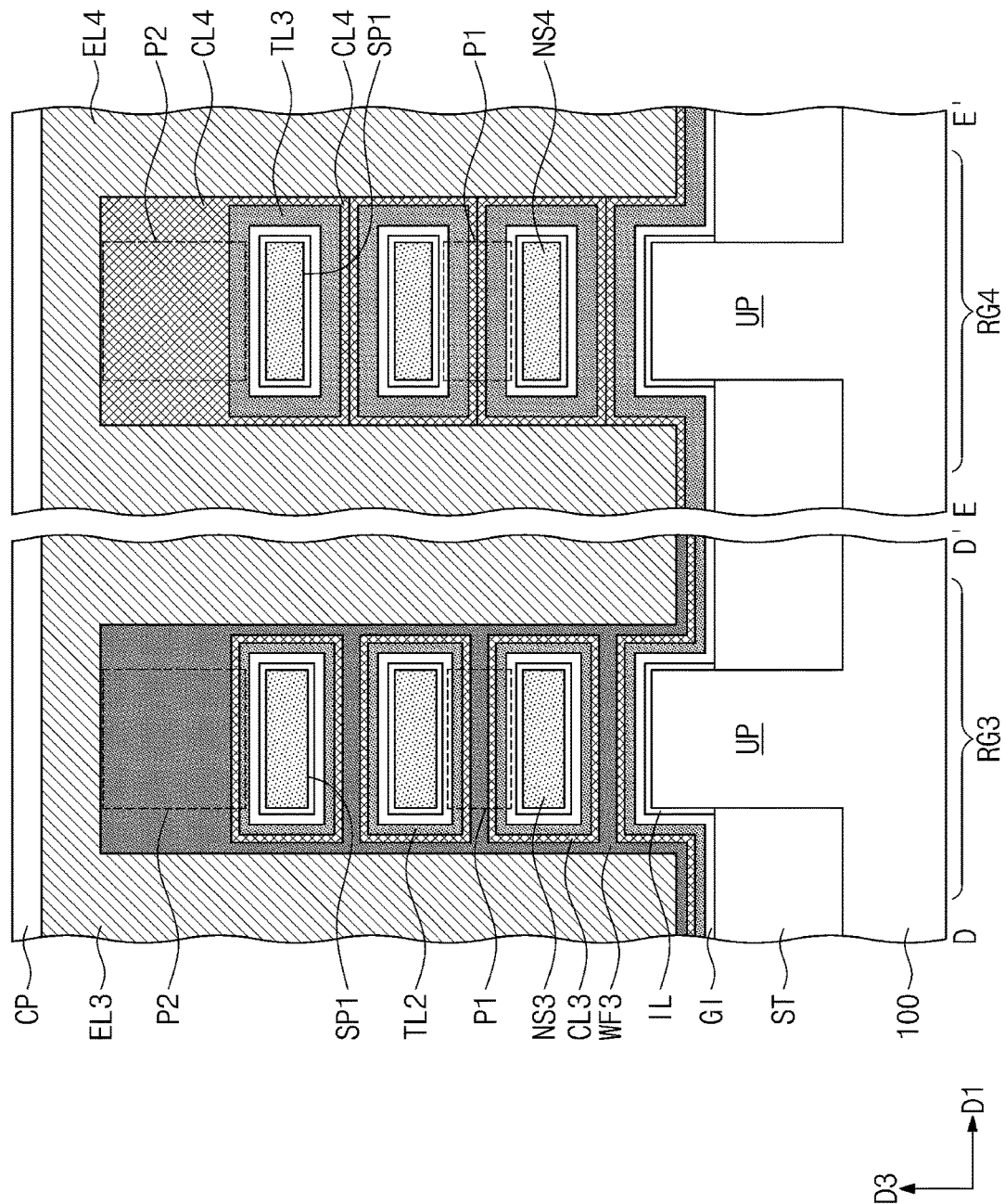
FIG. 11 illustrates a cross-sectional view taken along lines D-D' and E-E' of FIG. 7.
Figure 12:
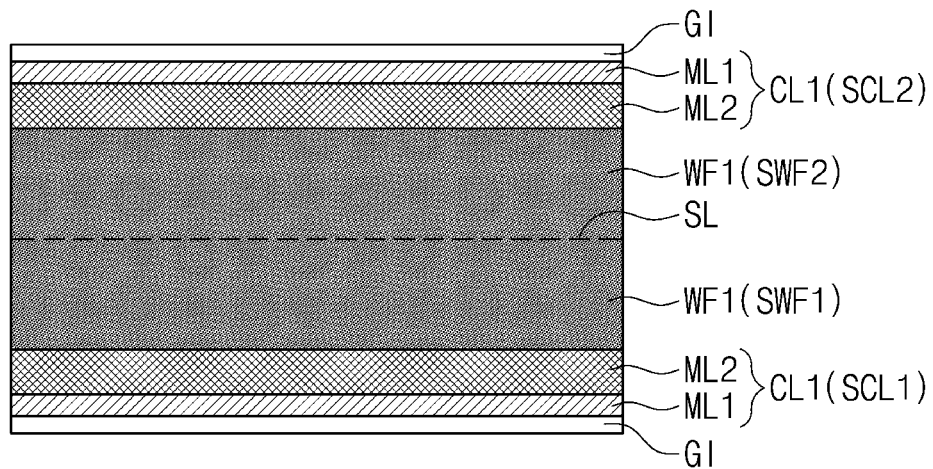
FIG. 12 illustrates an enlarged cross-sectional view showing a first part P1 of a first transistor TR1.
Figure 13:
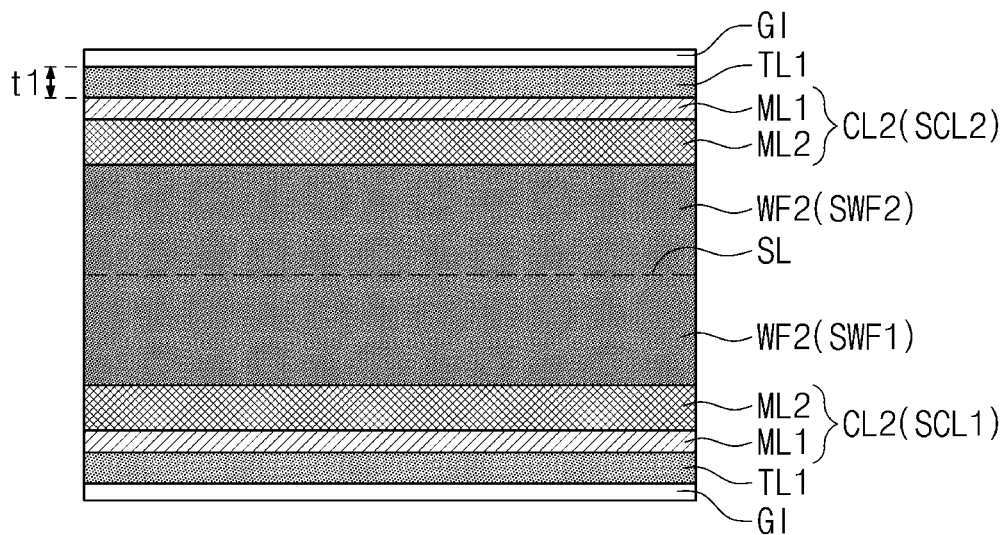
FIG. 13 illustrates an enlarged cross-sectional view showing a first part P1 of a second transistor TR2.
Figure 14:
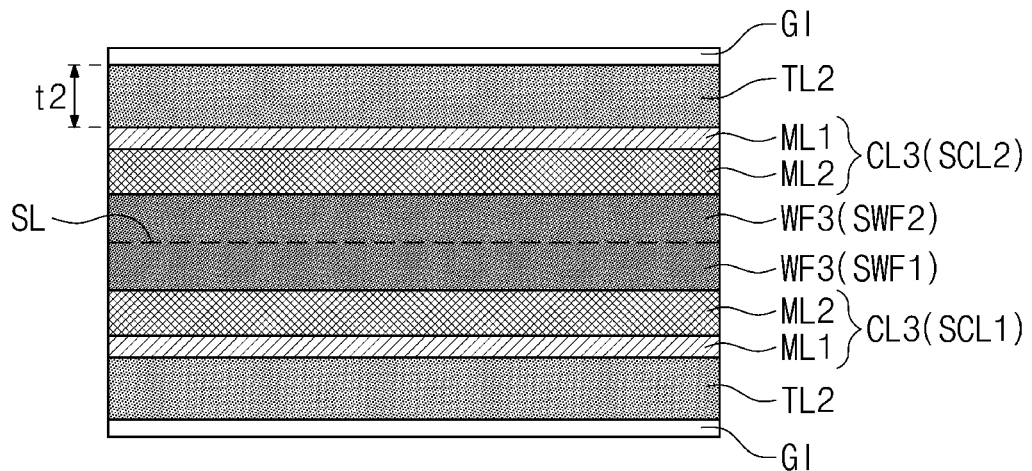
FIG. 14 illustrates an enlarged cross-sectional view showing a first part P1 of a third transistor TR3.
Figure 15:
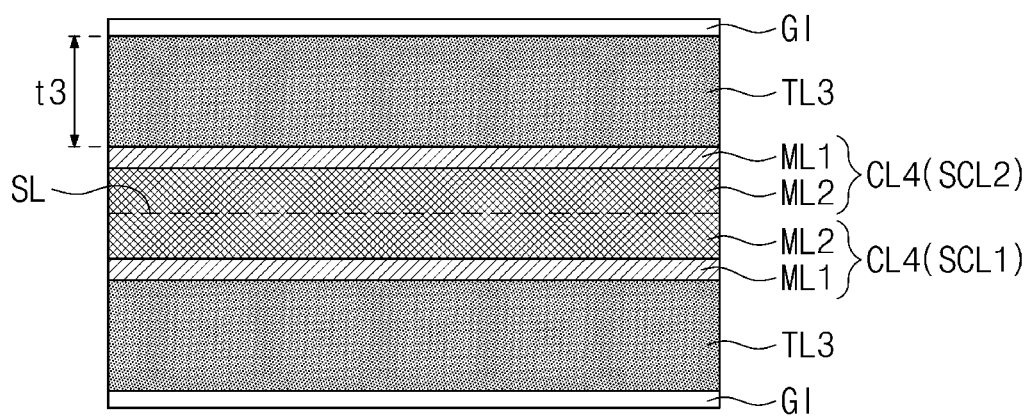
FIGS. 15 and 16 illustrate enlarged cross-sectional views showing a first part P1 of a fourth transistor TR4.
Figure 16:
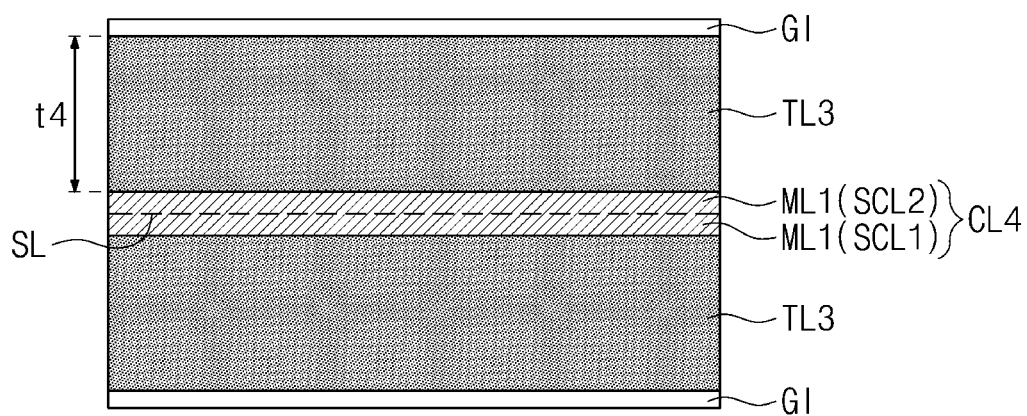

FIG. 7 illustrates a plan view showing a semiconductor device according to some example embodiments of the present inventive concepts. FIG. 8 illustrates a cross-sectional view taken along line A1-A1' of FIG. 7. FIG. 9 illustrates a cross-sectional view taken along line A2-A2' of FIG. 7. FIG. 10 illustrates a cross-sectional view taken along lines B-B' and C-C' of FIG. 7. FIG. 11 illustrates a cross-sectional view taken along lines D-D' and E-E' of FIG. 7. FIG. 12 illustrates an enlarged cross-sectional view showing a first part P1 of a first transistor TR1. FIG. 13 illustrates an enlarged cross-sectional view showing a first part P1 of a second transistor TR2. FIG. 14 illustrates an enlarged cross-sectional view showing a first part P1 of a third transistor TR3. FIGS. 15 and 16 illustrate enlarged cross-sectional views showing a first part P1 of a fourth transistor TR4. A description of duplicate components will be omitted in the interest of brevity.

Referring to FIGS. 7 to 16, a substrate 100 may be provided that includes first to fourth regions RG1 to RG4. The first to fourth regions RG1 to RG4 may be respectively provided thereon with first to fourth transistors TR1 to TR4. The first to fourth transistors TR1 to TR4 may have different threshold voltages from each other. For example, the threshold voltage of the fourth transistor TR4 may be greater than that of the third transistor TR3. The threshold voltage of the third transistor TR3 may be greater than that of the second transistor TR2. The threshold voltage of the second transistor TR2 may be greater than that of the first transistor TR1. However, some other example embodiments are not limited thereto.

The different threshold voltages of the first to fourth transistors TR1 to TR4 may be caused by different configurations of first to fourth gate electrodes GE1 to GE4. In some example embodiments, the first to fourth transistors TR1 to TR4 may be identically configured with regard to first to fourth semiconductor patterns NS1 to NS4, an interface layer IL, and a gate dielectric layer GI, except for the first to fourth gate electrodes GE1 to GE4. For example, the first to fourth semiconductor patterns NS1 to NS4 may be formed to have the same thickness at the same height. In some other example embodiments, the first to fourth transistors TR1 to TR4 may be differently configured with regard to the first to fourth semiconductor patterns NS1 to NS4, the interface layer IL, and the gate dielectric layer GI.

The first gate electrode GE1 may include a first capping pattern CL1 and a first work function pattern WF1 that are sequentially formed on the gate dielectric layer GI. The second gate electrode GE2 may include a first work function control pattern TL1, a second capping pattern CL2, and a second work function pattern WF2 that are sequentially formed on the gate dielectric layer GI. The third gate electrode GE3 may include a second work function control pattern TL2, a third capping pattern CL3, and a third work function pattern WF3 that are sequentially formed on the gate dielectric layer GI. The fourth gate electrode GE4 may include a third work function control pattern TL3 and a fourth capping pattern CL4 that are sequentially formed on the gate dielectric layer GI. The first to fourth gate electrodes GE1 to GE4 may respectively include first to fourth electrode patterns EL1 to EL4 on respective second parts P2 according to some example embodiments, or one or more of the first to fourth gate electrodes GE1 to GE4 may include no electrode pattern according to some other example embodiments.

The first gate electrode GE1 may include no work function control pattern. The first to third work function control patterns TL1 to TL3 may be simultaneously formed of the same material, but may have different thicknesses from each other. For example, the first to third work function control patterns TL1 to TL3 may be a nitride layer including one or more of titanium, tantalum, and/or tungsten. The first work function control pattern TL1 may have a first thickness t1, the second work function control pattern TL2 may have a second thickness t2, and the third work function control pattern TL3 may have a third thickness t3. The third thickness t3 may be greater than the second thickness t2, and the second thickness t2 may be greater than the first thickness t1. However, some other example embodiments are not limited thereto.

The first to fourth gate electrodes GE1 to GE4 may respectively include first to fourth capping patterns CL1 to CL4. The first to fourth capping patterns CL1 to CL4 may be simultaneously formed of the same material. For example, the first to fourth capping patterns CL1 to CL4 may have the same thickness. Each of the first to fourth capping patterns CL1 to CL4 may include a first sub-capping pattern SCL1 and a second sub-capping pattern SCL2. Each of the first to third work function patterns WF1 to WF3 may extend between the first sub-capping pattern SCL1 and the second sub-capping pattern SCL2, as shown in FIGS. 12 to 14. On the other hand, as shown in FIG. 15, the fourth gate electrode GE4 may include no work function pattern, and the first sub-capping pattern SCL1 and the second sub-capping pattern SCL2 may be in contact with each other at an interface SL therebetween. Alternatively, as shown in FIG. 16, the fourth capping pattern CL4 may include a first sub-capping pattern SCL1 and a second sub-capping pattern SCL2, and each of the first and second sub-capping patterns SCL1 and SCL2 may include a first metal nitride layer ML1, but do not include a second metal nitride layer. For example, the first metal nitride layers ML1 may be in contact with each other at an interface SL therebetween. In the example embodiment shown in FIG. 16, the third work function control pattern TL3 may have a fourth thickness t4 that may be greater than the third thickness t3 of the third work function control pattern TL3 in the example embodiment shown in FIG. 15.

According to some example embodiments of the present inventive concepts, the first to fourth regions RG1 to RG4 may be provided thereon with gate-all-around type transistors having different threshold voltages from each other. Thus, a semiconductor device having multiple threshold voltages may be achieved.

According to some example embodiments of the present inventive concepts, there may be provided a capping pattern composed of a double layer. The double layer capping pattern may prevent (inhibit, limit, or reduce) diffusion of dopants (e.g., silicon and/or aluminum) contained in a work function pattern, and a threshold voltage of a transistor may decrease (e.g., the threshold voltage of the transistor may be reduced by a desired extent, without changing a thickness of a work function layer and/or a work function control layer, by controlling or adjusting an aluminum concentration in a first metal layer of the double layer capping pattern).

Although some example embodiments of the present inventive concepts have been discussed with reference to accompanying figures, it will be understood that various changes in form and details may be made therein without departing from the spirit and scope of the present inventive concepts. It therefore will be understood that the example embodiments described above are just illustrative but not limitative in all aspects.

What is claimed is:

1. A semiconductor device, comprising:
   a plurality of semiconductor patterns that are sequentially stacked and spaced apart from each other on a substrate; and
   a gate electrode on the plurality of semiconductor patterns,
   the gate electrode including a capping pattern and a work function pattern that are sequentially stacked on the plurality of semiconductor patterns,
   the capping pattern including a first metal nitride layer including a first metal element, and a second metal nitride layer including a second metal element whose work function is greater than a work function of the first metal element, the first metal nitride layer being disposed between the second metal nitride layer and the plurality of semiconductor patterns, and
   the first metal nitride layer being thinner than the second metal nitride layer, wherein
  the plurality of semiconductor patterns includes a first sub-semiconductor pattern, and a second sub-semiconductor pattern on the first sub-semiconductor pattern,
  the capping pattern includes a first sub-capping pattern surrounding the first sub-semiconductor pattern, and a second sub-capping pattern surrounding the second sub-semiconductor pattern, and
  the work function pattern extends between the first sub-capping pattern and the second sub-capping pattern.

2. The semiconductor device of claim 1, wherein a resistivity of the second metal nitride layer is less than a resistivity of the first metal nitride layer.

3. The semiconductor device of claim 1, wherein the first metal element includes aluminum (Al), niobium (Nb), magnesium (Mg), lanthanum (La), or vanadium (V).

4. The semiconductor device of claim 3, wherein the second metal element includes titanium (Ti), tantalum (Ta), molybdenum (Mo), or tungsten (W).

5. The semiconductor device of claim 4, wherein the first metal nitride layer further includes the second metal element.

6. The semiconductor device of claim 1, wherein
the first metal nitride layer includes an AlN layer or a TiAlN layer, and
the second metal nitride layer includes a TiN layer or a TiAlN layer.

7. The semiconductor device of claim 1, wherein the work function pattern includes the first metal element.

8. The semiconductor device of claim 7, wherein the work function pattern further includes the second metal element.

9. The semiconductor device of claim 1, wherein the second metal nitride layer is about 2 times to about 5 times thicker than the first metal nitride layer.

10. The semiconductor device of claim 1, wherein the work function pattern includes a first sub-work function pattern surrounding the first sub-semiconductor pattern, and a second sub-work function pattern surrounding the second sub-semiconductor pattern, the first sub-work function pattern and the second sub-work function pattern being in contact with each other.

11. The semiconductor device of claim 1, wherein
the gate electrode further includes an electrode pattern on the work function pattern,
the work function pattern includes a first sub-work function pattern surrounding the first sub-semiconductor pattern, and a second sub-work function pattern surrounding the second sub-semiconductor pattern, and
the electrode pattern extends between the first sub-work function pattern and the second sub-work function pattern.

12. A semiconductor device, comprising:
a substrate; and
a plurality of transistors including at least a first transistor and a second transistor on the substrate,
the first transistor including a first gate dielectric layer and a first gate electrode that are sequentially stacked on a plurality of first semiconductor patterns, the first gate electrode including a first capping pattern and a first work function pattern that are sequentially stacked on the plurality of first semiconductor patterns,
wherein
  the plurality of first semiconductor patterns includes a first sub-semiconductor pattern, and a second sub-semiconductor pattern on the first sub-semiconductor pattern,
  the first capping pattern includes a first sub-capping pattern surrounding the first sub-semiconductor pattern, and a second sub-capping pattern surrounding the second sub-semiconductor pattern, and
  the first work function pattern extends between the first sub-capping pattern and the second sub-capping pattern,
the second transistor including a second gate dielectric layer and a second gate electrode that are sequentially stacked on a plurality of second semiconductor patterns, the second gate electrode including a first work function control pattern, a second capping pattern, and a second work function pattern that are sequentially stacked on the plurality of second semiconductor patterns, and
each of the first capping pattern and the second capping pattern including a first metal nitride layer including a first metal element, and a second metal nitride layer including a second metal element whose work function is greater than a work function of the first metal element.

13. The semiconductor device of claim 12, wherein
the first capping pattern is in contact with the first gate dielectric layer, and
a threshold voltage of the first transistor is less than a threshold voltage of the second transistor.

14. The semiconductor device of claim 12, wherein the first work function pattern includes the second metal element.

15. The semiconductor device of claim 14, wherein each of the first work function control pattern and the second capping pattern includes a TiN layer.

16. The semiconductor device of claim 12, wherein
the plurality of transistors further includes a third transistor on the substrate,
the third transistor includes a third gate dielectric layer and a third gate electrode that are sequentially stacked on a plurality of third semiconductor patterns,
the third gate electrode includes a second work function control pattern and a third capping pattern that are sequentially stacked on the plurality of third semiconductor patterns, and
the second work function control pattern is thicker than the first work function control pattern.

17. The semiconductor device of claim 12, wherein
the plurality of transistors further includes a fourth transistor on the substrate,
the fourth transistor includes a fourth gate dielectric layer and a fourth gate electrode that are sequentially stacked on a plurality of fourth semiconductor patterns,
the fourth gate electrode includes a fourth capping pattern,
the plurality of fourth semiconductor patterns include a first sub-semiconductor pattern, and a second sub-semiconductor pattern on the first sub-semiconductor pattern, and
the fourth capping pattern includes a first sub-capping pattern surrounding the first sub-semiconductor pattern; and a second sub-capping pattern surrounding the second sub-semiconductor pattern, the first sub-capping pattern and the second sub-capping pattern being in contact with each other.

18. The semiconductor device of claim 17, wherein each of the first sub-capping pattern and the second sub-capping pattern includes a metal nitride layer including the first metal element, the metal nitride layer of the first sub-capping pattern being in contact with the metal nitride layer of the second sub-capping pattern.

19. A semiconductor device, comprising:
a substrate; and
a plurality of transistors including at least a first transistor and a fourth transistor on the substrate,
the first transistor including a first gate electrode including a first capping pattern on a plurality of first semiconductor patterns,
wherein
the plurality of first semiconductor patterns include a first sub-semiconductor pattern, and a second sub-semiconductor pattern on the first sub-semiconductor pattern,
the first capping pattern includes a first sub-capping pattern surrounding the first sub-semiconductor pattern, and a second sub-capping pattern surrounding the second sub-semiconductor pattern, and
a first work function pattern extends between the first sub-capping pattern and the second sub-capping pattern, the fourth transistor including a fourth gate electrode including a fourth capping pattern on a plurality of fourth semiconductor patterns, the fourth capping pattern including a plurality of second sub-capping patterns surrounding the plurality of fourth semiconductor patterns, and
one or more of the first capping pattern and the fourth capping pattern including a plurality of different layers.

\* \* \* \* \*